(12) United States Patent
Shin

(10) Patent No.: US 7,339,966 B2
(45) Date of Patent: Mar. 4, 2008

(54) SEMICONDUCTOR LASER DEVICE AND METHOD FOR MANUFACTURING THE SAME

(75) Inventor: Young Chul Shin, Seoul (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 223 days.

(21) Appl. No.: 11/319,081

(22) Filed: Dec. 28, 2005

(65) Prior Publication Data

US 2006/0187990 A1    Aug. 24, 2006

(30) Foreign Application Priority Data

Feb. 21, 2005    (KR) .................... 10-2005-0013986

(51) Int. Cl.
*H01S 5/00* (2006.01)
(52) U.S. Cl. ................................ 372/45.01; 372/46.01
(58) Field of Classification Search ............ 372/50.11, 372/45.012, 45.01, 43.01, 50.1
See application file for complete search history.

(56) References Cited

U.S. PATENT DOCUMENTS 5,305,341 A * 4/1994 Nishikawa et al. ...... 372/45.01
5,406,574 A * 4/1995 Rennie et al. ........... 372/45.01
5,933,442 A * 8/1999 Sawano et al. ......... 372/45.013
6,606,335 B1 * 8/2003 Kuramata et al. ....... 372/45.01
6,798,808 B1 * 9/2004 Konushi et al. ........ 372/45.013

FOREIGN PATENT DOCUMENTS

JP      2000-286507 A    10/2000
WO      WO 00/04615      1/2000

* cited by examiner

*Primary Examiner*—Minsun Oh Harvey
*Assistant Examiner*—Tuan N. Nguyen
(74) *Attorney, Agent, or Firm*—McDermott Will & Emery LLP (57) ABSTRACT

The present invention provides a semiconductor laser device capable of improving reproducibility and electrical properties of the device, and a manufacturing method thereof. The semiconductor laser device according to the invention includes a first p type AlGaInP-based clad layer formed on an active layer, and a second p-type AlGaInP-based clad layer formed on the first p-type AlGaInP-based clad layer and having a ridge structure. The first p-type AlGaInP-based clad layer is Zn-doped with a concentration that restrains Zn diffusion into the active layer, and the second p-type AlGaInP-based clad layer is Mg-doped with a concentration higher than that of the first AlGaInP-based clad layer.

16 Claims, 8 Drawing Sheets

SEMICONDUCTOR LASER DEVICE AND METHOD FOR MANUFACTURING THE SAME

RELATED APPLICATION

This application claims the benefit of Korean Patent Application No. 2005-0013986 filed on Feb. 21, 2005, in the Korean Intellectual Property Office, the disclosure of which is incorporated herein by reference.

BACKGROUND OF THE INVENTION

1. Field of the Invention

The present invention relates to a semiconductor laser device and a manufacturing method thereof. More particularly, the present invention relates to a high-power group III-V compound semiconductor laser device capable of achieving improved electrical properties and optical efficiency, and a method for manufacturing the same.

2. Description of the Related Art

Recently, a semiconductor laser device has been used in numerous areas such as optical sensor, optical communication, optical pickup, and display. Also a variety of applications need a high-power laser device. Especially, AlGaAs-based or AlGaInP-based compound semiconductor laser device is utilized as an optical source of CD or DVD systems. In addition, there have been development and mass-production of a next-generation optical storage system using a blue-colored semiconductor laser device with 405 nm wavelength as an optical source.

In general, the semiconductor laser device includes upper and lower clad layers for supplying electric currents and an active layer formed therebetween to have induced emission of photons. The semiconductor laser device has the upper clad layer (e.g. p-type clad layer) formed as a ridge structure so that electric currents are supplied only through the ridge, thereby achieving improved injection efficiency of electric currents. WO 00/04615 discloses a group III-nitride semiconductor laser device having a ridge structure, and a method for manufacturing the same.

Figure 1:
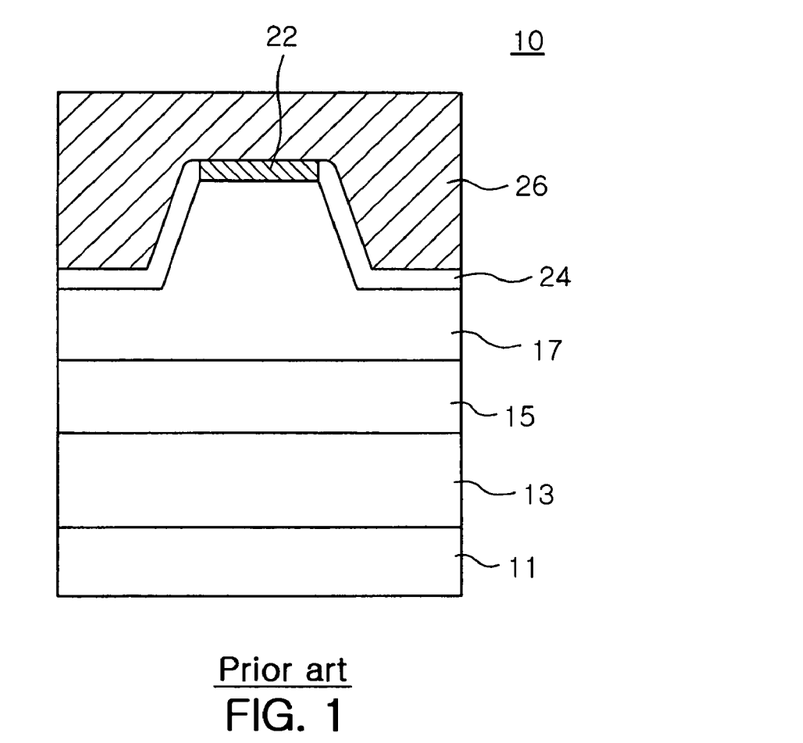
FIG. 1 is a sectional view of a conventional semiconductor laser device.

FIG. 1 is a sectional view of a conventional ridged AlGaInP-based semiconductor laser device. Referring to FIG. 1, the conventional ridged AlGaInP-based semiconductor laser device 10 includes an AlGaInP-based n-type clad layer 13, a p-type clad layer 17 and a p-type contact layer 22 sequentially stacked on a substrate 11 made of GaAs and etc. An upper part of the p-type clad layer 17 has a ridge structure, and a current blocking layer 24 is formed on both sides of the p-type clad layer 17. Also a p-electrode 26 is formed on the p-type contact layer 22. An active layer 15 may have a multiple quantum well structure, e.g. 2 optical guide layers and a multiple quantum well layer interposed there between.

In particular, in a high-power semiconductor laser device, the p-type clad layer 17 is doped with p-type impurities in a high concentration to prevent electrons injected from the n-type clad layer 13 to the active layer 15 from being leaked to the p-type clad layer 17 (to prevent degradation of heat characteristics). Zinc (Zn) or Magnesium (Mg) is mainly used as p-type impurities to dope the p-type clad layer 17.

Zn is easily doped in an AlGaInP-based semiconductor and has excellent electrical properties. But Zn diffuses easily when a doping concentration is high. Therefore Zn doped in the p-type clad layer 17 with a high concentration of $10^{18}$ cm$^{-3}$ or more easily diffuses into the active layer 15, deteriorating optical properties and reliability of the laser device. Japanese Laid-Open Patent Application No. 2000-286507 teaches a method for stacking an undoped spacer layer between an active layer and a p-type clad layer to inhibit Zn diffusion into the active layer. However, a separate spacer layer stacked will complicate a process and increase costs thereof.

Compared to Zn, Mg allows high concentration without diffusion. Therefore, by using Mg as a dopant to dope the p-type clad layer, a device with superior heat characteristics is achievable. But, Mg doping causes time delay. Thus, even if Mg is used as a dopant in forming the p-type clad layer 17, the p-type clad layer is Mg-doped not immediately but after a certain time passes. Consequently, some areas of the p-type clad layer 17 adjacent to the active layer 15 is not Mg-doped, deteriorating electrical properties. Moreover, the lengths of Mg-undoped areas are not uniform, degrading reproducibility of device properties.

SUMMARY OF THE INVENTION

The present invention has been made to solve the foregoing problems of the prior art and it is therefore an object of the present invention to provide a semiconductor laser device which restrains p-type dopant diffusion into an active layer, and has superior electrical properties and improved optical efficiency.

It is another object of the invention to provide a semiconductor laser device which prevents p-type dopant diffusion into an active layer and improves electrical properties and optical efficiency.

According to an aspect of the invention for realizing the object, there is provided a semiconductor laser device comprising:

an n type AlGaInP-based clad layer formed on a substrate;

an active layer formed on the n-type AlGaInP-based clad layer;

a first p-type AlGaInP-based clad layer formed on the active layer; and a second p-type AlGaInP-based clad layer having a ridge structure formed on the first p-type AlGaInP-based clad layer, wherein the first p-type AlGaInP-based clad layer is Zn-doped with a concentration that restrains Zn diffusion into the active layer, and the second p-type AlGaInP-based clad layer is Mg-doped with a concentration higher than that of the first p-type AlGaInP-based clad layer.

Preferably, the first p-type AlGaInP-based clad layer is Zn-doped with a concentration of $8 \times 10^{17}$ cm$^{-3}$ or less. More preferably, the first p-type AlGaInP-based clad layer is Zn-doped with a concentration of $1 \times 10^{17}$ to $8 \times 10^{17}$ cm$^{-3}$, and much more preferably $5 \times 10^{17}$ to $8 \times 10^{17}$ cm$^{-3}$. Further, preferably, the second p-type AlGaInP-based clad layer is Mg-doped with a concentration of at least $1 \times 10^{18}$ cm$^{-3}$. More preferably, the second p-type AlGaInP-based clad layer is Mg-doped with a concentration of $1 \times 10^{18}$ to $5 \times 10^{18}$ cm$^{-3}$, and more preferably $3 \times 10^{18}$ to $5 \times 10^{18}$ cm$^{-3}$.

According to one embodiment of the invention, an etch-stop layer may be provided between the first p-type AlGaInP-based clad layer and the second p-type AlGaInP-based clad layer. The etch-stop layer serves to specify a point where etching stops in case of etching for forming a ridge structure.

According to another aspect of the invention for realizing the object, there is provided a method for manufacturing a semiconductor laser device comprising steps of:

sequentially forming an n-type AlGaInP-based clad layer and an active layer on a substrate;

forming a first p-type AlGaInP-based clad layer Zn-doped with a concentration that restrains Zn diffusion into the active layer; and forming a second p-type AlGaInP-based clad layer Mg-doped with a concentration higher than that of the first p-type AlGaInP-based clad layer.

Preferably, the first p-type AlGaInP-based clad layer is Zn-doped with a concentration of $8 \times 10^{17}$ cm$^{-3}$ or less. More preferably, the first p-type AlGaInP-based clad layer is Zn-doped with a concentration of $1 \times 10^{17}$ to $8 \times 10^{17}$ cm$^{-3}$, and much more preferably $5 \times 10^{17}$ to $8 \times 10^{17}$ cm$^{-3}$. Also, preferably, the second p-type AlGaInP-based clad layer is Mg-doped with a concentration of at least $1 \times 10^{18}$ cm$^{-3}$. More preferably, the second p-type AlGaInP-based clad layer is Mg-doped with a concentration of $1 \times 10^{18}$ to $5 \times 10^{18}$ cm$^{-3}$, and much more preferably $3 \times 10^{18}$ to $5 \times 10^{18}$ cm$^{-3}$.

According to one embodiment of the present invention, the method for manufacturing the semiconductor laser device further comprises forming an etch-stop layer between the first p-type AlGaInP-based clad layer forming step and the second p-type AlGaInP-based clad layer forming step. Also, the method further comprises selectively etching the second p-type AlGaInP-based clad layer to form a ridge structure.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings. The scope of the invention is not limited to the embodiments described below. The embodiments are set forth to provide more complete explanation of the invention for those skilled in the art. Therefore, shape and size of the components in the drawings may be exaggerated for clearer explanation, and the same reference numerals are used throughout the different drawings to designate the same or similar component.

The present invention provides a method for controlling doping materials and doping concentration of a first p-type AlGaInP-based clad layer and a second p-type AlGaInP-based clad layer so as to prevent dopant diffusion into an active layer and to enhance electrical properties and optical efficiency. To realize this object, the inventor has analyzed doping characteristics of Zinc (Zn) and magnesium (Mg) used as a dopant of a semiconductor laser device based on experiments. The results are shown in FIGS. 2 to 5.

Figure 2:
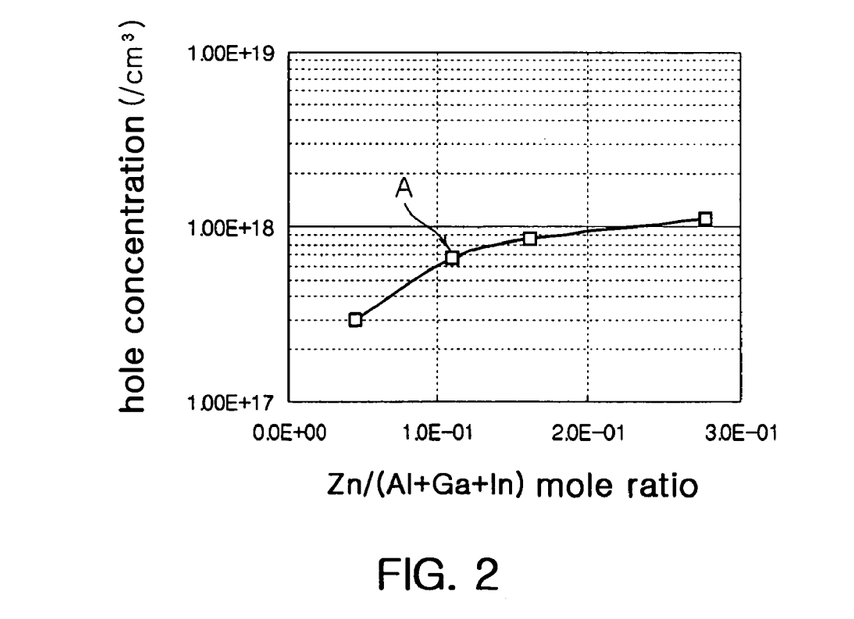
FIG. 2 is a graph illustrating a hole concentration in accordance with Zn mole ratio in Zn-doping AlGaInP material.

FIG. 2 is a graph illustrating a hole concentration in accordance with Zn mole ratio in Zn-doping AlGaInP material. Referring to FIG. 2, the lateral axis indicates a mole ratio of Zn dopant to total group III elements Al, Ga, In. The mole ratio is in proportion to Zn doping concentration. The longitudinal axis indicates hole concentration. Therefore, a curve shown in FIG. 2 indicates changes in hole concentration in accordance with Zn doping concentration.

As shown in FIG. 2, with increase in Zn doping concentration in AlGaInP material, a hole concentration also increases linearly but the linearity changes in a certain point A to a moderate curve. The point A where the linearity changes means that more Zn-doping in the point A does not result in subsequent increase in hole concentration, diminishing doping efficiency. This is because Zn atoms doped beyond the point A are not placed at lattice points but at interstitial sites of group III elements. Accordingly, Zn atoms placed at interstitial sites do not create holes and have high speed of diffusion. Therefore, Zn atoms doped with a high concentration beyond the point A are easily diffused into an adjacent area.

Meanwhile, if AlGaInP material is doped below the point A, Zn atoms are placed at lattice points of group III elements and have lower diffusion speed. Therefore Zn atoms doped below the point A are not easily diffused into an adjacent area. The analysis shows that Zn doping concentration in the A point is about $8 \times 10^{17}$ cm$^{-3}$.

Figure 4:
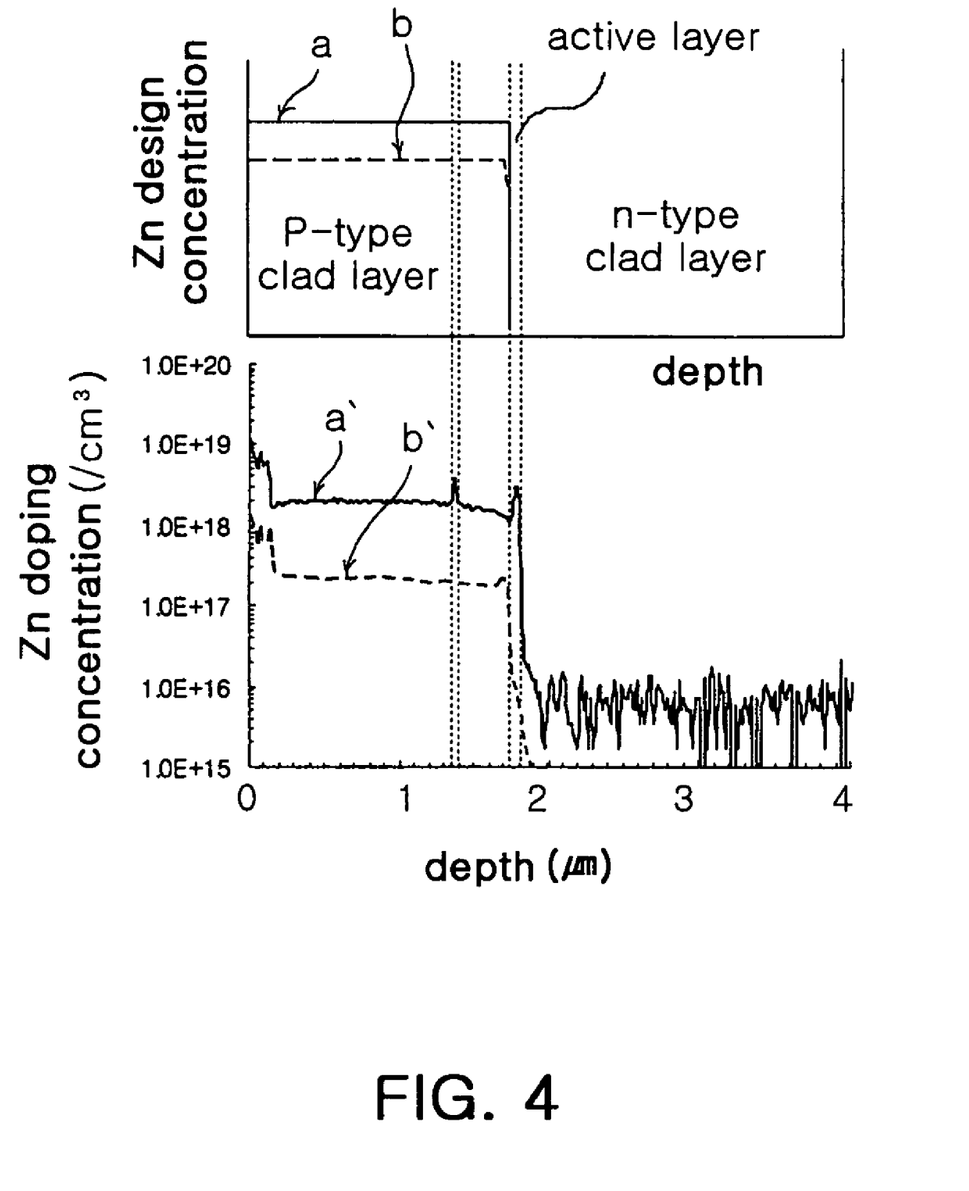
FIG. 4 is a graph illustrating Zn design concentration in accordance with a depth of an AlGaInP-based semiconductor laser device and an actual doping concentration of Zn.

This phenomenon is apparent from doping profile of FIG. 4. FIG. 4 shows Zn design concentration profile in accordance with a depth of AlGaInP-based semiconductor laser device and an actual Zn doping concentration profile. Zn doping concentration profile shown in FIG. 4 is measured based on Secondary Ion Mass Spectroscopy (SIMS). As shown in FIG. 4, if Zn design concentration in the p-type clad layer is $1 \times 10^{18}$ cm$^{-3}$ or more (a curve in FIG. 4), according to actual Zn doping profile (curve a' of FIG. 4), a great amount of Zn diffuses into the active layer and thus Zn doping concentration in the active layer becomes at least $1 \times 10^{18}$ cm$^{-3}$. A great amount of Zn diffused into the active layer creates a defect serving as a recombination level, thus deteriorating device properties.

In contrast, if Zn design concentration in the p-type clad layer is $8 \times 10^{17}$ cm$^{-3}$ or less (curve b in FIG. 4), according to actual Zn doping profile (curve b' of FIG. 4), Zn diffusion into the active layer is restrained, and the active layer has very low Zn concentration that is $10^{16}$ cm$^{-3}$ or less. Therefore, if Zn doping concentration in the p-type clad layer is $8 \times 10^{17}$ cm$^{-3}$ or less, Zn diffusion into the active layer is inhibited.

Figure 3:
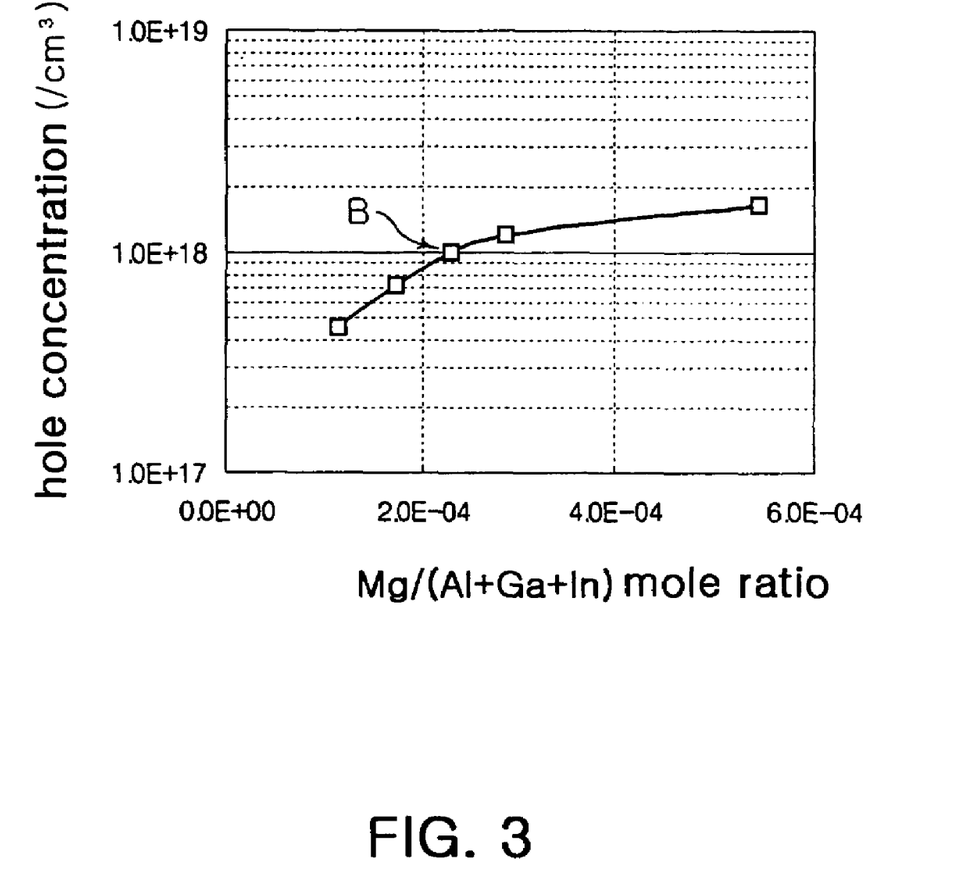
FIG. 3 is a graph illustrating a hole concentration in accordance with Mg mole ratio in Mg-doping AlGaInP material.

FIG. 3 is a graph illustrating hole concentration in accordance with Mg mole ratio in Mg-doping AlGaInP material. Referring to FIG. 3, the lateral axis indicates a mole ratio of Mg dopant to total group III elements Al, Ga, In. The mole ratio is in proportion to Mg doping concentration. The longitudinal axis indicates hole concentration. Therefore a curve shown in FIG. 3 is obtained by plotting changes in hole concentration in accordance with Mg doping concentration.

As shown in FIG. 3, in the case of Mg doping, with increase in Mg doping concentration in AlGaInP material, hole concentration increases linearly and the linearity changes in a specified point B to a moderate curve. But compared with Zn doping, Mg doping concentration in the point B is bigger than Zn doping concentration in the point A (refer to FIG. 2). Mg doping concentration in the point B is greater than $10^{18}$ cm$^{-3}$. Therefore, doping AlGaInP-based material with Mg dopant ensures low diffusion and high doping concentration. In fact, if Mg doping concentration is at least $1 \times 10^{18}$ cm$^{-3}$, Mg hardly diffuses into an adjacent active layer.

Figure 5:
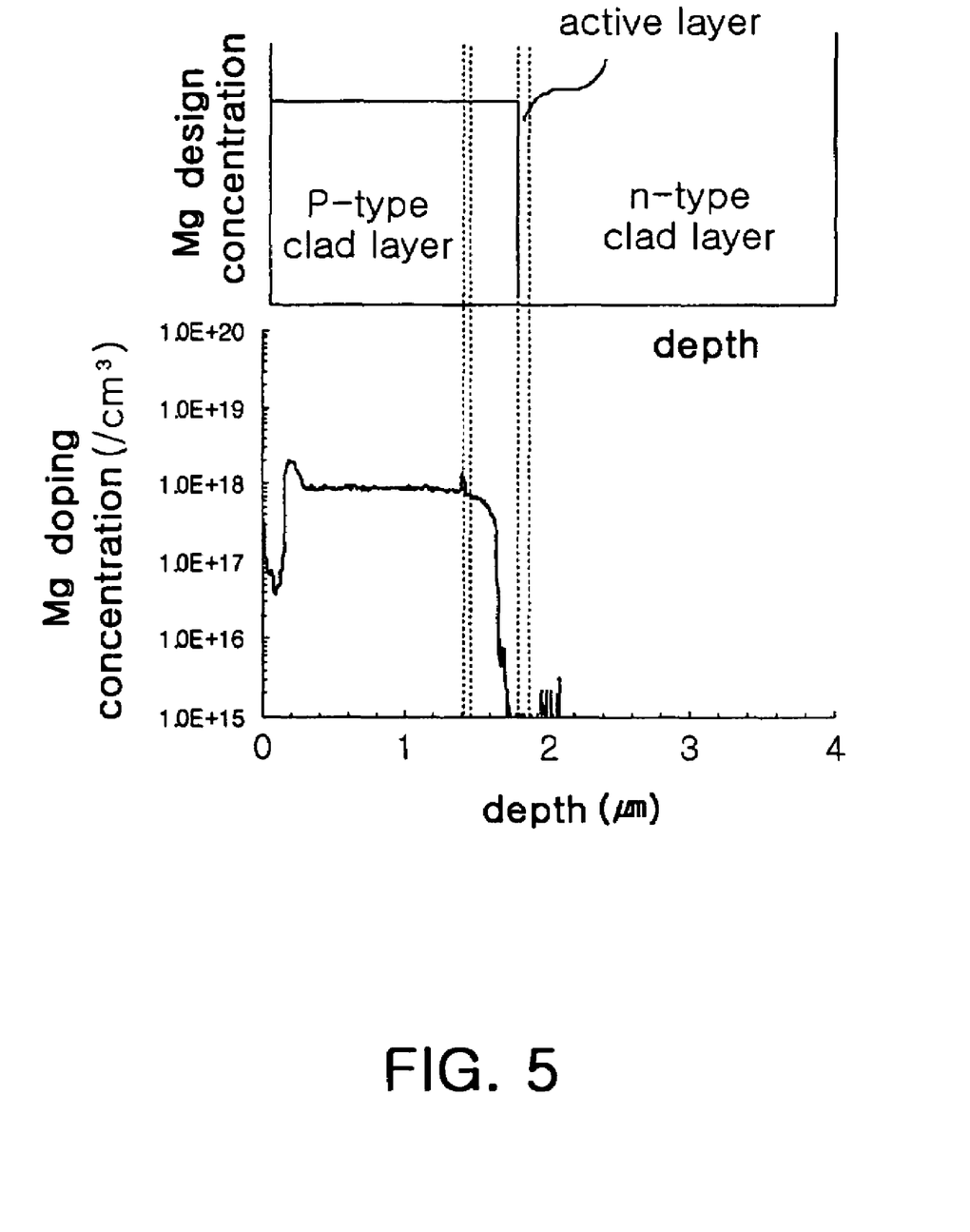
FIG. 5 is a graph illustrating Mg design concentration in accordance with a depth of the AlGaInP-based semiconductor laser device and an actual doping concentration of Mg.

FIG. 5 shows Mg design concentration profile in accordance with AlGaInP-based semiconductor laser device and an actual Mg doping concentration profile thereof. Mg doping profile in FIG. 5 is measured based on SIMS. Referring to FIG. 5, even if Mg design concentration in the p-type clad layer is $1 \times 10^{18}$ cm$^{-3}$, according to an actual Mg doping concentration profile, Mg does not diffuse into the active layer. However Mg doping causes time delay, leaving the p-type clad layer near the active layer almost undoped with Mg. Likewise, if the area adjacent to the active layer is hardly Mg-doped, the area serves as a resistance, increasing operating voltage and consumption power, and degrading device reproducibility.

Figure 6:
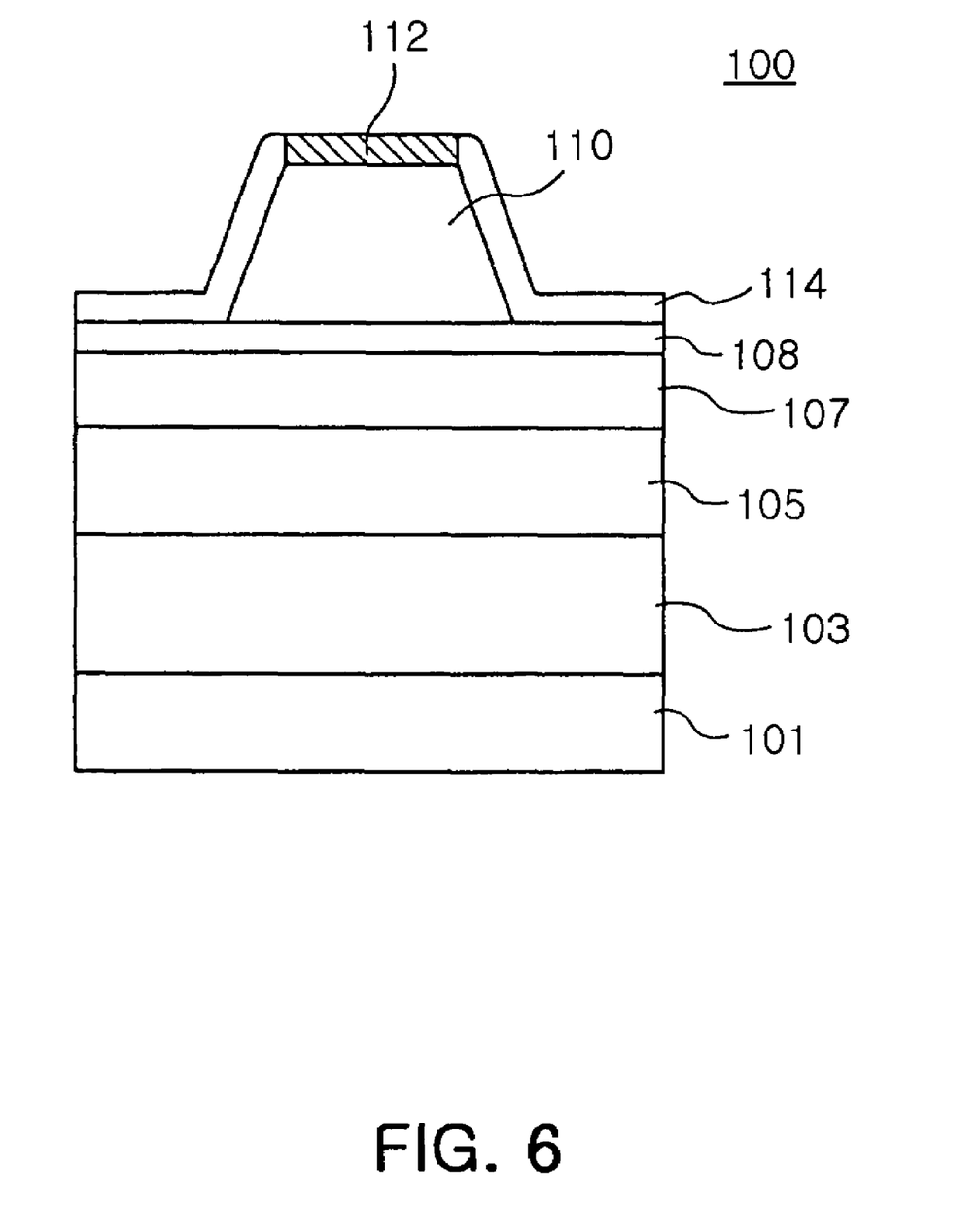
FIG. 6 is a sectional view of a semiconductor laser device according to one embodiment of the present invention.

FIG. 6 is a sectional view of a semiconductor laser device according to one embodiment of the invention. Referring to FIG. 6, the semiconductor laser device 100 includes an n-type AlGaInP-based clad layer 103, an active layer 105, a first p-type AlGaInP clad layer 107 and an etch-stop layer 108 sequentially formed on an n-type GaAs substrate 101. The etch-stop layer 108 includes a second AlGaInP-based layer 110 and a p-type contact layer 112 having a ridge structure. On both sides of the second p-type AlGaInP-based clad layer 110 a current-blocking layer 114 is formed. The etch-stop layer 108 may be formed of Zn-doped AlGaInP-based material and has lower Al composition than that of the first and second AlGaInP-based clad layers 107, 110.

The first p-type AlGaInP-based clad layer 107 is a Zn-doped n-type semiconductor. Especially, the first p-type AlGaInP-based clad layer 107 is Zn-doped with a concentration that restrains Zn diffusion into an adjacent active layer 105 (about $8 \times 10^{17}$ cm$^{-3}$ or less). As explained in reference to FIGS. 2 and 4, if the first p-type AlGaInP-based clad layer 107 is Zn-doped with a concentration of $8 \times 10^{17}$ cm$^{-3}$ or less, Zn diffusion into the active layer 105 can be restrained. But if the first p-type AlGaInP-based clad layer 107 is Zn-doped with too low a concentration, Zn diffusion is inhibited but heat characteristics of laser device maybe deteriorated. Therefore, the first AlGaInP-based clad layer 107 is preferably Zn-doped with a concentration of $1 \times 10^{17}$ to $8 \times 10^{17}$ cm$^{-3}$, and more preferably $5 \times 10^{17}$ to $8 \times 10^{17}$ cm$^{-3}$. By controlling Zn-doping concentration within the aforementioned scope, Zn diffusion to the active layer 105 is restrained and heat characteristics of laser device is prevented. Moreover, as stated later, Zn doping concentration of $8 \times 10^{17}$ cm$^{-3}$ or less allows the first p-type AlGaInP-based clad layer 107 to suffer less optical absorption by hole carriers.

The second p-type AlGaInP-based clad layer 110 is Mg-doped. Since the second AlGaInP-based clad layer 110 is placed over the etch-stop layer 108, it does not suffer deterioration of electrical properties or device reproducibility resulting from time delay by Mg doping as explained in FIGS. 3 and 5. That is, the Zn-doped first p-type AlGaInP-based clad layer 107 interposed between the active layer and the second AlGaInP-based clad layer 110 does not allow of undoping of the first p-type AlGaInP-based clad layer 107 adjacent to the active layer (refer to FIG. 5).

In addition, the second p-type AlGaInP-based clad layer 110 is doped with a concentration higher than that of the first p-type AlGaInP-based clad layer 107. Especially, the second p-type AlGaInP-based clad layer 110 is preferably Mg-doped with a concentration of at least $1 \times 10^{18}$ cm$^{-3}$. By increasing doping concentration of the second p-type AlGaInP-basd clad layer 110, the second p-type AlGaInP-based clad layer 110 having a narrow ridge structure suffers less resistance. Also, operating voltage and consumption power of laser device can be reduced. But if the second AlGaInP-based clad layer 110 is Mg-doped with too high a concentration, a defect may occur, degrading crystalline quality. As a result, the second p-type AlGaInP-based clad layer 110 is preferably Mg-doped with a concentration of $1 \times 10^{18}$ to $5 \times 10^{18}$ cm$^{-3}$, more preferably $3 \times 10^{18}$ to $5 \times 10^{18}$ cm$^{-3}$. By controlling Mg doping concentration within the aforesaid scope, electrical properties of laser device are enhanced.

Figure 7:
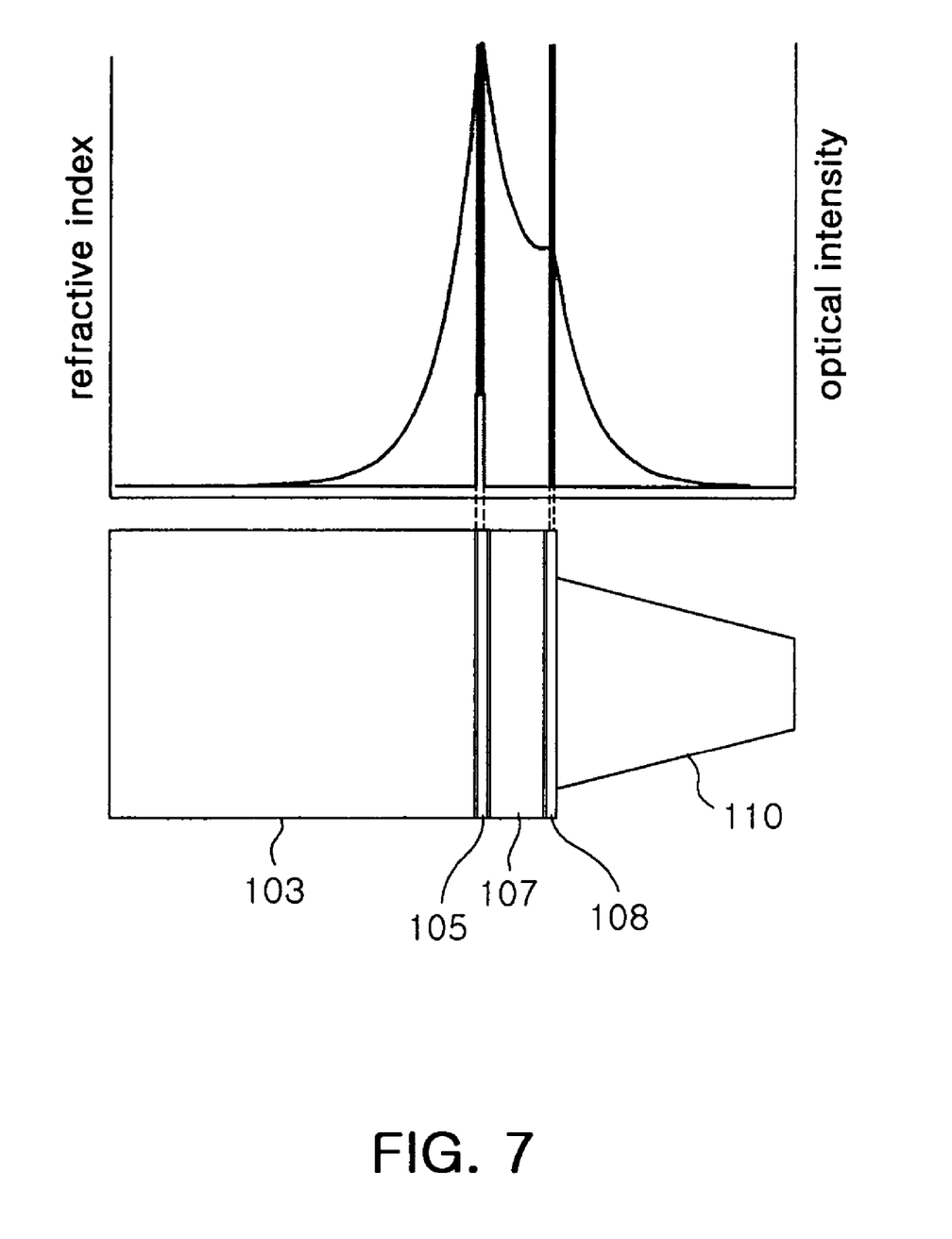
FIG. 7 is a graph illustrating optical intensity distribution and reflective index distribution in accordance with a depth of the semiconductor laser device according to one embodiment of the present invention.

FIG. 7 is a graph illustrating optical intensity distribution and reflective index distribution in accordance with the semiconductor laser device of FIG. 6. In the graph of FIG. 7, a lateral axis indicates a depth along the thickness of laser device. FIG. 7 shows reflective index distribution having sharp bends in the active layer 105 and the etch-stop layer 108. Also referring to FIG. 7, the first p-type clad layer 107 adjacent to the active layer 105 has high distribution of optical intensity. The first p-type clad layer 107 is doped with a concentration of $8 \times 10^{17}$ cm$^{-3}$ or less, and thus has relatively low hole concentration. Consequently, the first p-type AlGaInP-based clad layer 107 having high distribution of optical intensity suffers less optical absorption by hole carriers.

The manufacturing method for the semiconductor laser device according to one embodiment of the invention will be explained hereunder in reference to FIGS. 8 to 11. According to the embodiment, the etch-stop layer is used as a point where etching stops in case of an etching process for forming a ridge structure. However, in another manufacturing method, the etch-stop layer may not be formed.

Figure 8:
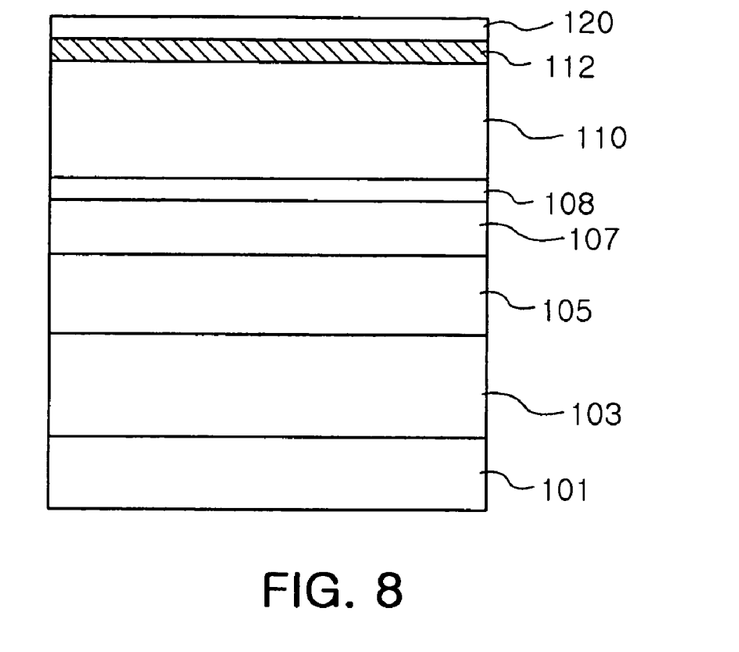
FIGS. 8 to 11 are sectional views illustrating a method for manufacturing the semiconductor laser device according to one embodiment of the present invention.

First, in reference to FIG. 8, an n-type AlGaInP-based clad layer 103, an active layer 105, a first p-type AlGaInP-based clad layer 107, an etch-stop layer 108, a second p-type AlGaInP-based clad layer 110 and a p-type contact layer 112 are formed on an n-type GaAs substrate 101 via Metal Organic Chemical Vapor Deposition (MOCVD). On the p-type contact layer 120, a SiO$_2$ layer 120 is formed for mask patterning. In forming the first p-type AlGaInP-based clad layer 107, for example, diethylZn (DEZn) is used as a source to form a zinc-doped epitaxial layer. At this time, to restrain zinc diffusion into the active layer 105, the first p-type AlGaInP-based clad layer 107 is doped with a concentration of $8 \times 10^{17}$ cm$^{-3}$ or less. Preferably, to inhibit zinc diffusion and improve heat characteristics, the first p-type AlGaInP-based clad layer is doped with a concentration of $1 \times 10^{17}$ to $8 \times 10^{17}$ cm$^{-3}$, and more preferably $5 \times 10^{17}$ to $8 \times 10^{17}$ cm$^{-3}$.

Further, in forming the second p-type AlGaInP-based clad layer 110, for example, bis(cyclopentadienyl) magnesium $(C_5H_5)_2$Mg is used as a source to form an Mg-doped epitaxial layer. At this time, to reduce resistance of the second p-type AlGaInP clad layer 110, the second p-type AlGaInP-based clad layer 110 is doped with a concentration of at least $1\times10^{18}$ cm$^{-3}$. Preferably, to reduce resistance and prevent a defect, the second p-type AlGaInP-based clad layer 110 is doped with a concentration of $1\times10^{18}$ to $5\times10^{18}$ cm$^{-3}$, and more preferably $3\times10^{18}$ to $5\times10^{18}$ cm$^{-3}$.

Figure 9:
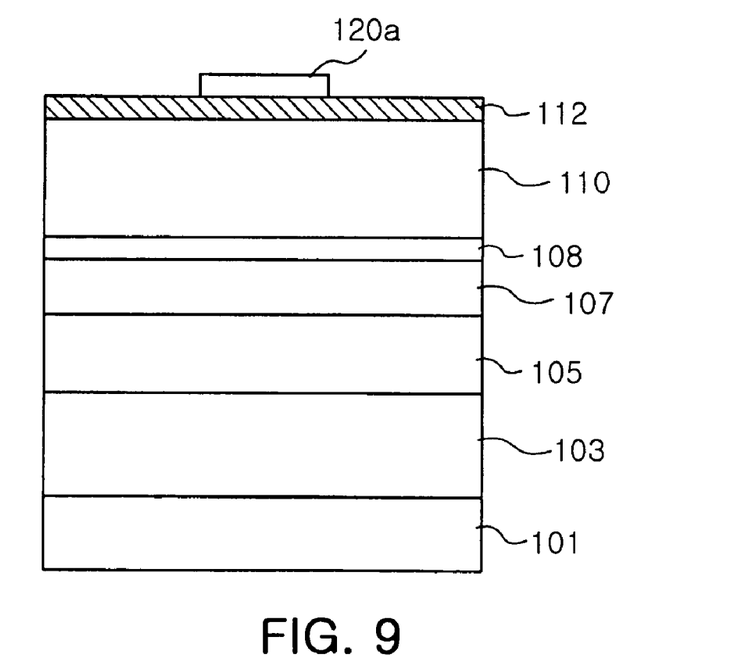
Figure 10:
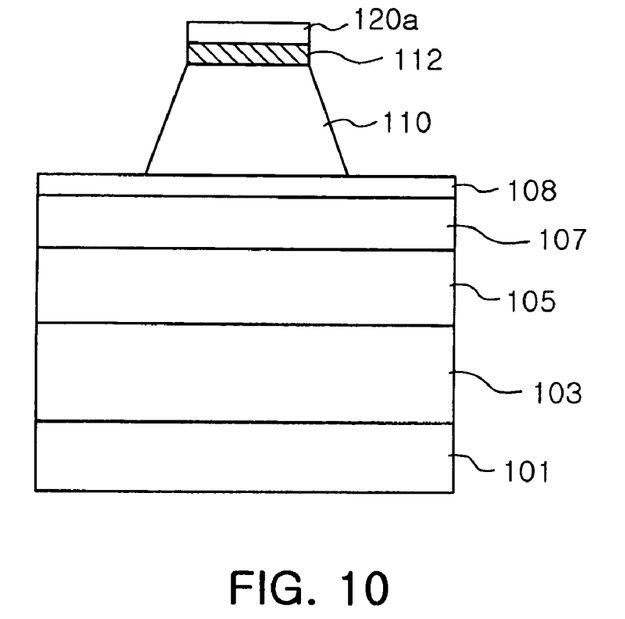

Next, as shown in FIG. 9, a SiO$_2$ layer 120 is patterned through selective etching to form a striped mask pattern 120a. Thereafter, as shown in FIG. 10, the mask pattern 120a is used as an etching mask to selectively etch the p-type contact layer 112 and the second p-type AlGaInP-based clad layer 110, and then to form a ridge structure. The etch-stop layer 108 is hardly etched due to use of an etchant having a higher etching selectivity for the second p-type AlGaInP-based clad layer 110 over the etch-stop layer 108. Therefore, the etch-stop layer 108 serves as a point where etching stops to form a ridge structure.

Figure 11:
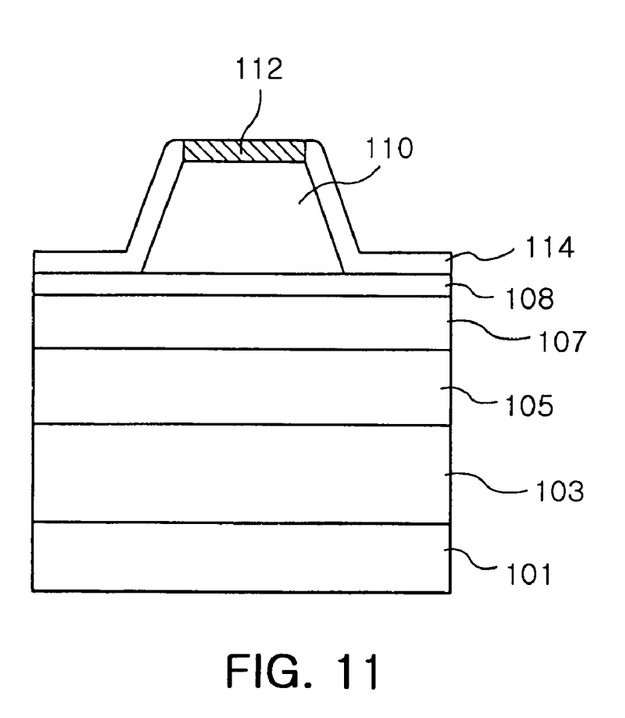

Then, as shown in FIG. 11, a mask pattern 120a is removed to form an insulator such as SiO$_2$ or an n-type GaAs current blocking layer 114 on both sides of the ridged second p-type AlGaInP-based clad layer 110 and on an etch-stop layer 108. Thereafter, an n-type electrode is formed on the lower substrate 101 and a p-type electrode is formed on the p-type contact layer 112 (not illustrated). As a result, the semiconductor laser device according to the embodiment is manufactured.

According to the present invention, as stated above, by controlling dopant elements and doping concentration of the first p-type AlGaInP-based clad layer and the second p-type AlGaInP-based clad layer, zinc diffusion into the active layer is restrained, and device reproducibility resulting from time delay by Mg-doping is prevented from deteriorating. This, consequently, leads to improvement in electrical properties of the device, and reduction in operating voltage and consumption power. Furthermore, a relatively diminished doping concentration of the first p-type AlGaInP-based clad layer having higher optical distribution reduces optical absorption by hole carriers. This elevates internal optical efficiency of the semiconductor laser device and ensures high optical efficiency.

While the present invention has been shown and described in connection with the preferred embodiments, it will be apparent to those skilled in the art that modifications and variations can be made without departing from the spirit and scope of the invention as defined by the appended claims.

What is claimed is:

1. A semiconductor laser device comprising:
    an n type AlGaInP-based clad layer formed on a substrate;
    an active layer formed on the n-type AlGaInP-based clad layer;
    a first p-type AlGaInP-based clad layer formed on the active layer; and
    a second p-type AlGaInP-based clad layer having a ridge structure formed on the first p-type AlGaInP-based clad layer,
    wherein the first p-type AlGaInP-based clad layer is Zn-doped with a concentration that restrains Zn diffusion into the active layer, and the second p-type AlGaInP-based clad layer is Mg-doped with a concentration higher than that of the first p-type AlGaInP-based clad layer.

2. The semiconductor laser device according to claim 1, wherein the first p-type AlGaInP-based clad layer is Zn-doped with a concentration of $8\times10^{17}$ cm$^{-3}$ or less.

3. The semiconductor laser device according to claim 1, wherein the first p-type AlGaInP-based clad layer is Zn-doped with a concentration of $1\times10^{17}$ to $8\times10^{17}$ cm$^{-3}$.

4. The semiconductor laser device according to claim 1, wherein the first p-type AlGaInP-based clad layer is Zn-doped with a concentration of $5\times10^{17}$ to $8\times10^{17}$ cm$^{-3}$.

5. The semiconductor laser device according to claim 1, wherein the second p-type AlGaInP-based clad layer is Mg-doped with a concentration of at least $1\times10^{18}$ cm$^{-3}$.

6. The semiconductor laser device according to claim 1, wherein the second p-type AlGaInP-based clad layer is Mg-doped with a concentration of $1\times10^{18}$ to $5\times10^{18}$ cm$^{-3}$.

7. The semiconductor laser device according to claim 1, wherein the second p-type AlGaInP-based clad layer is Mg-doped with a concentration of $3\times10^{18}$ to $5\times10^{18}$ cm$^{-3}$.

8. The semiconductor laser device according to claim 1, further comprising an etch stop layer formed between the first p-type AlGaInP-based clad layer and the second p-type AlGaInP-based p-type clad layer.

9. A method for manufacturing a semiconductor laser device comprising steps of:
    sequentially forming an n-type AlGaInP-based clad layer and an active layer on a substrate;
    forming a first p-type AlGaInP-based clad layer Zn-doped with a concentration that restrains Zn diffusion into the active layer;
    selectively etching the second p-type AlGaInP-based clad layer to form a ridge structure;
    and forming a second p-type AlGaInP-based clad layer Mg-doped with a concentration higher than that of the first p-type AlGaInP-based clad layer.

10. The method according to claim 9, wherein the first p-type AlGaInP-based clad layer is Zn-doped with a concentration of $8\times10^{17}$ cm$^{-3}$ or less.

11. The method according to claim 9, wherein the first p-type AlGaInP-based clad layer is Zn-doped with a concentration of $1\times10^{17}$ to $8\times10^{17}$ cm$^{-3}$.

12. The method according to claim 9, wherein the first p-type AlGaInP-based clad layer is Zn-doped with a concentration of $5\times10^{17}$ to $8\times10^{17}$ cm$^{-3}$.

13. The method according to claim 9, wherein the second p-type AlGaInP-based clad layer is Mg-doped with a concentration of at least $1\times10^{18}$ cm$^{-3}$.

14. The method according to claim 9, wherein the second p-type AlGaInP-based clad layer is Mg-doped with a concentration of $1\times10^{18}$ to $5\times10^{18}$ cm$^{-3}$.

15. The method according to claim 9, wherein the second p-type AlGaInP-based clad layer is Mg-doped with a concentration of $3\times10^{18}$ to $5\times10^{18}$ cm$^{-3}$.

16. The method according to claim 9, further comprising forming an etch-stop layer between the first p-type AlGaInP-based clad layer forming step and the second p-type AlGaInP-based clad layer forming step.

* * * * *